United States Patent
Chen et al.

(10) Patent No.: US 11,515,881 B2
(45) Date of Patent: Nov. 29, 2022

(54) ANALOG TO DIGITAL CONVERTER DEVICE AND METHOD FOR CALIBRATING CLOCK SKEW

(71) Applicants: GLOBAL UNICHIP CORPORATION, Hsinchu (TW); TAIWAN SEMICONDUCTOR MANUFACTURING COMPANY, LTD., Hsinchu (TW)

(72) Inventors: Yu-Chu Chen, Hsinchu (TW); Hsin-Han Han, Hsinchu (TW); Wen-Juh Kang, Hsinchu (TW)

(73) Assignees: GLOBAL UNICHIP CORPORATION, Hsinchu (TW); TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

(21) Appl. No.: 17/447,812

(22) Filed: Sep. 15, 2021

(65) Prior Publication Data
US 2022/0321135 A1 Oct. 6, 2022

(30) Foreign Application Priority Data
Mar. 31, 2021 (TW) .................................. 110111865

(51) Int. Cl.
H03M 1/06 (2006.01)
H03M 1/10 (2006.01)
H03M 1/08 (2006.01)

(52) U.S. Cl.
CPC ....... H03M 1/0624 (2013.01); H03M 1/0836 (2013.01); H03M 1/1033 (2013.01)

(58) Field of Classification Search
CPC .. H03M 1/0624; H03M 1/0836; H03M 1/121; H03M 1/1033
(Continued)

(56) References Cited

U.S. PATENT DOCUMENTS 7,250,885 B1 7/2007 Naim
9,000,962 B1 4/2015 Leuciuc
(Continued)

FOREIGN PATENT DOCUMENTS

TW I693799 B 5/2020
TW I699975 B 7/2020
(Continued)

OTHER PUBLICATIONS

Hegong Wei et al., An 8 Bit 4 GS/s 120 mW CMOS ADC, IEEE Journal of Solid-State Circuits, vol. 49, No. 8, Aug. 2014, p. 1751-1761.

*Primary Examiner* — Khai M Nguyen
(74) *Attorney, Agent, or Firm* — CKC & Partners Co., LLC

(57) ABSTRACT

An analog to digital converter (ADC) device includes ADC circuits, a calibration circuit and a skew adjusting circuit. The ADC circuits convert an input signal according to clock signals, to generate first quantized outputs. The calibration circuit calibrates the first quantized outputs to generate second quantized outputs. The skew adjusting circuit includes an estimating circuit and a feedback circuit. The estimating circuit analyzes the second quantized outputs to generate detection signals, wherein the detection signals are related to time difference information of the clock signals. The skew adjusting circuit outputs the detection signals as adjustment signals, wherein the adjustment signals are configured to reduce a clock skew of the ADC circuits. The feedback circuit analyzes the detection signals generated by the estimating circuit, to generate a feedback signal to the estimating circuit, wherein the estimating circuit is configured to adjust the detection signals according to the feedback signal.

20 Claims, 8 Drawing Sheets

(58) Field of Classification Search
USPC .......................................... 341/118, 120, 155
See application file for complete search history.

(56) References Cited

U.S. PATENT DOCUMENTS

| | | | |
|---|---|---|---|
| 9,264,059 B2* | 2/2016 | Tousi | .................... H03M 1/183 |
| 9,270,291 B1 | 2/2016 | Parnaby et al. | |
| 9,806,732 B1* | 10/2017 | Khoshgard | ......... H03M 1/1038 |
| 10,218,372 B1 | 2/2019 | Farley et al. | |
| 2020/0235748 A1 | 7/2020 | Kang et al. | |

FOREIGN PATENT DOCUMENTS

| | | | |
|---|---|---|---|
| TW | I704773 B | 9/2020 |
| TW | I712267 B | 12/2020 |

* cited by examiner

# ANALOG TO DIGITAL CONVERTER DEVICE AND METHOD FOR CALIBRATING CLOCK SKEW

CROSS-REFERENCE TO RELATED APPLICATION

This application claims priority to Taiwan Application Serial Number 110111865, filed Mar. 31, 2021, which is herein incorporated by reference in its entirety.

BACKGROUND

Field of Invention

This disclosure relates to an analog-to-digital converter (ADC) device, and in particular to a time-interleaved ADC device and a method for calibrating clock skew.

Description of Related Art

ADCs are commonly used in various electronic devices to convert analog signals to digital signals for signal processing. In practical applications, an ADC will affect its own resolution or linearity due to a gain error, an offset error, or a timing error. The calibration performed by the prior art technologies for the timing error is not accurate enough. As a result, the phase errors between different channels may be incorrectly converged.

SUMMARY

An aspect of present disclosure relates to an analog to digital converter device. The analog to digital converter device includes a plurality of analog to digital converter circuits, a calibration circuit and a skew adjusting circuit. The analog to digital converter circuits are configured to convert an input signal according to a plurality of clock signals, to generate a plurality of first quantized outputs. The calibration circuit is configured to perform at least one calibration operation according to the first quantized outputs, to generate a plurality of second quantized outputs. The skew adjusting circuit includes an estimating circuit and a feedback circuit. The estimating circuit is configured to analyze the second quantized outputs, to generate a plurality of detection signals, wherein the detection signals are related to a plurality of time difference information of the clock signals, the skew adjusting circuit is configured to output the detection signals as a plurality of adjustment signals, and the adjustment signals are configured to reduce a clock skew of the analog to digital converter circuits. The feedback circuit is configured to analyze the detection signals generated by the estimating circuit, to generate a feedback signal to the estimating circuit, wherein the estimating circuit is configured to adjust the detection signals according to the feedback signal.

Another aspect of present disclosure relates to an analog to digital converter device. The analog to digital converter device includes a plurality of analog to digital converter circuits, a calibration circuit and a skew adjusting circuit. The analog to digital converter circuits are configured to convert an input signal according to a plurality of clock signals, to generate a plurality of first quantized outputs. The calibration circuit is configured to perform at least one calibration operation according to the first quantized outputs, to generate a plurality of second quantized outputs. The skew adjusting circuit includes an estimating circuit, an adjusting circuit and a feedback circuit. The estimating circuit is configured to analyze the second quantized outputs, to generate a plurality of detection signals, wherein the detection signals are related to a plurality of time difference information of the clock signals. The adjusting circuit is configured to generate a plurality of adjustment signals according to the detection signals, wherein the adjustment signals are configured to reduce a clock skew of the analog to digital converter circuits. The feedback circuit is configured to analyze a plurality of first trigger signals generated by the adjusting circuit, to generate a feedback signal to the estimating circuit, wherein the estimating circuit is configured to adjust the detection signals according to the feedback signal.

Another aspect of present disclosure relates to a method for calibrating a clock skew. The method for calibrating the clock skew includes: performing at least one calibration operation according to a plurality of first quantized outputs generated by a plurality of analog to digital converter circuits, to generate a plurality of second quantized outputs; by an estimating circuit of a skew adjusting circuit, analyzing the second quantized outputs, to generate a plurality of detection signals, wherein the detection signals are related to a plurality of time difference information of a plurality of clock signals received by the analog to digital converter circuits, the skew adjusting circuit is configured to output the detection signals as a plurality of adjustment signals, and the adjustment signals are configured to reduce a clock skew of the analog to digital converter circuits; and by a feedback circuit of the skew adjusting circuit, analyzing the detection signals generated by the estimating circuit, to generate a feedback signal to the estimating circuit, wherein the estimating circuit is configured to adjust the detection signals according to the feedback signal.

Another aspect of present disclosure relates to a method for calibrating a clock skew. The method for calibrating the clock skew includes: performing at least one calibration operation according to a plurality of first quantized outputs generated by a plurality of analog to digital converter circuits, to generate a plurality of second quantized outputs; by an estimating circuit, analyzing the second quantized outputs, to generate a plurality of detection signals, wherein the detection signals are related to a plurality of time difference information of a plurality of clock signals received by the analog to digital converter circuits; by an adjusting circuit, generating a plurality of adjustment signals according to the detection signals, wherein the adjustment signals are configured to reduce a clock skew of the analog to digital converter circuits; and by a feedback circuit, analyzing a plurality of first trigger signals generated by the adjusting circuit, to generate a feedback signal to the estimating circuit, wherein the estimating circuit is configured to adjust the detection signals according to the feedback signal.

DETAILED DESCRIPTION

The embodiments are described in detail below with reference to the appended drawings to better understand the aspects of the present disclosure. However, the provided embodiments are not intended to limit the scope of the disclosure, and the description of the structural operation is not intended to limit the order in which they are performed. Any device that has been recombined by components and produces an equivalent function is within the scope covered by the disclosure.

The terms used in the entire specification and the scope of the patent application, unless otherwise specified, generally have the ordinary meaning of each term used in the field, the content disclosed herein, and the particular content.

The terms "coupled" or "connected" as used herein may mean that two or more elements are directly in physical or electrical contact, or are indirectly in physical or electrical contact with each other. It can also mean that two or more elements interact with each other.

Figure 1A:
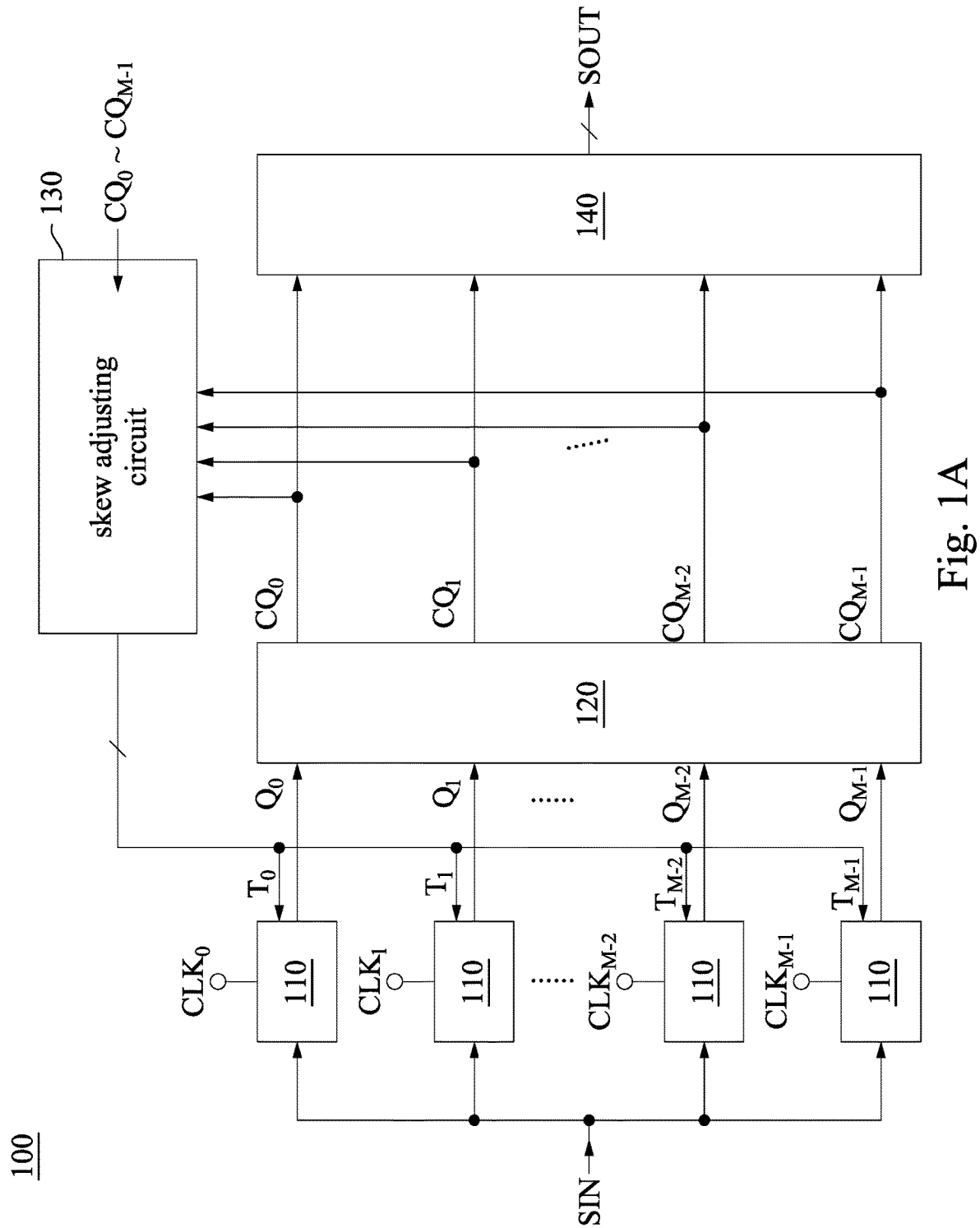
FIG. 1A depicts a schematic diagram of an ADC device in accordance with some embodiments of the present disclosure.
Figure 1B:
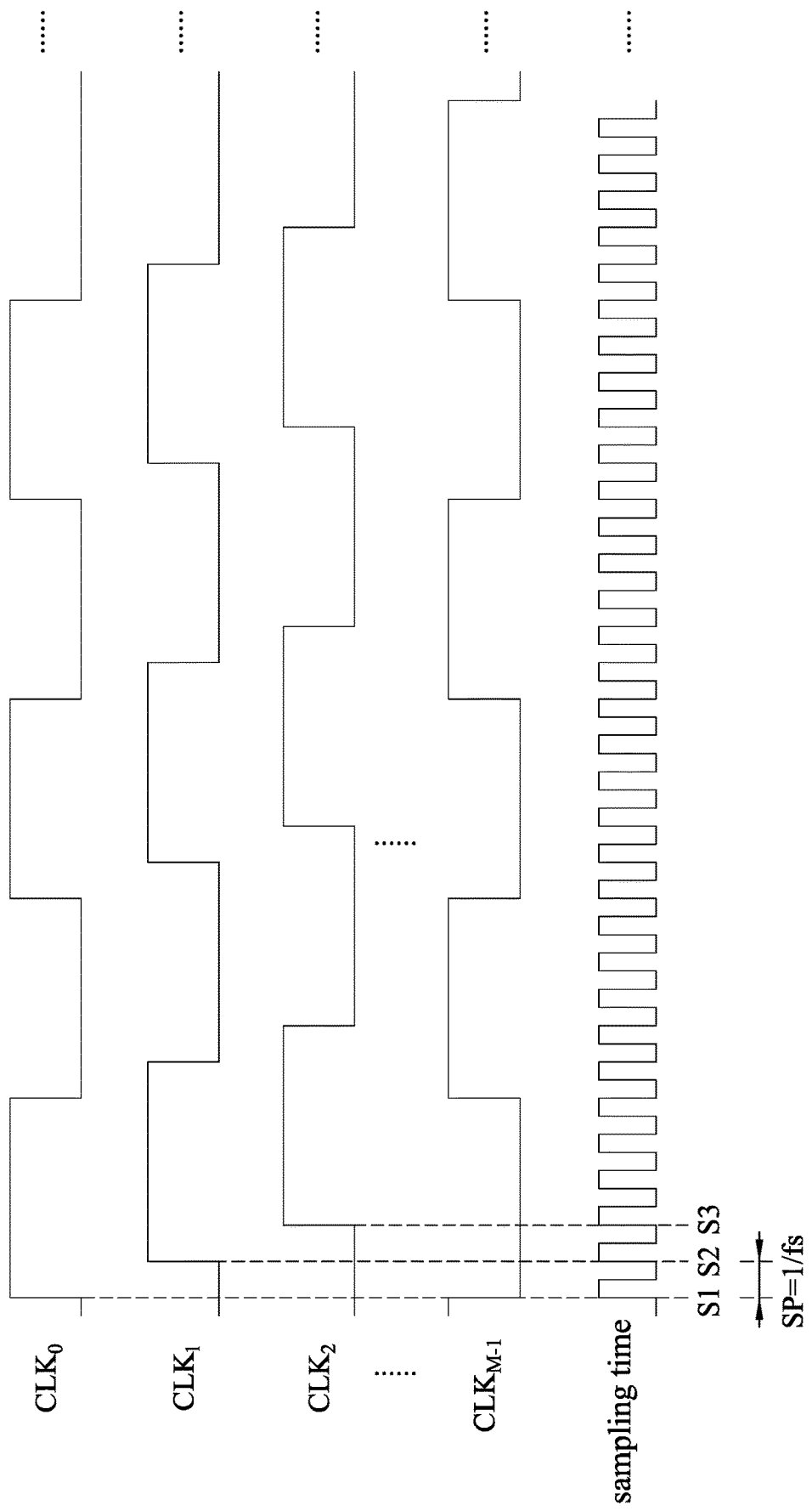
FIG. 1B depicts a schematic diagram of waveforms of a number of clock signals in FIG. 1A in accordance with some embodiments of the present disclosure.

Referring to FIGS. 1A and 1B, FIG. 1A depicts a schematic diagram of an ADC device 100 in accordance with some embodiments of the present disclosure. FIG. 1B depicts a schematic diagram of waveforms of a number of clock signals $CLK_0$-$CLK_{M-1}$ in FIG. 1A in accordance with some embodiments of the present disclosure. In some embodiments, the ADC device 100 is operated to be a time-interleaved ADC with multiple channels.

In some embodiments, the ADC device 100 includes a number of ADC circuits 110, a calibration circuit 120, a skew adjusting circuit 130 and an output circuit 140. It is noted that each of the ADC circuits 110 is operated to be a signal channel. In other words, the ADC device 100 includes M channels in this example. In some embodiments, M is an even number. As shown in FIG. 1A, the ADC circuits 110 are configured to perform analog-to-digital conversions on an input signal SIN according to the clock signals $CLK_0$-$CLK_{M-1}$ to generate quantized outputs $Q_0$-$Q_{M-1}$ correspondingly.

As shown in FIG. 1B, there is a time interval between two adjacent clock signals of the clock signals $CLK_0$-$CLK_{M-1}$. Therefore, two adjacent channels would perform sampling operations and analog-to-digital conversions at different times. For example, the first channel (that is, the ADC circuit 110 operated according to the clock signal $CLK_0$) samples the input signal SIN at a first sampling time S1 and performs the analog-to-digital conversion, the second channel (that is, the ADC circuit 110 operated according to the clock signal $CLK_1$) samples the input signal SIN at a second sampling time S2 and performs the analog-to-digital conversion, and the third channel (that is, the ADC circuit 110 operated according to the clock signal $CLK_2$) samples the input signal SIN at a third sampling time S3 and performs the analog-to-digital conversion. A difference between the sampling time S1 and sampling time S2 is a sampling period SP (which corresponds to a sampling frequency fs, that is, SP=1/fs). By analogy, M channels can be operated according to multiple interleaved timings.

As mentioned above, the calibration circuit 120 is coupled to each of the ADC circuits 110 to receive the quantized outputs $Q_0$-$Q_{M-1}$. The calibration circuit 120 can perform at least one calibration operation according to the quantized outputs $Q_0$-$Q_{M-1}$ to calibrate offset and gain errors of the ADC circuits 110, and generate a number of quantized outputs $CQ_0$-$CQ_{M-1}$ that have been calibrated.

In some embodiments, the calibration circuit 120 may be a foreground calibration circuit or a background calibration circuit. For example, the calibration circuit 120 may include a pseudo-random number generator circuit (not shown) and a digital processing circuit (not shown). The pseudo-random number generator circuit generates a calibration signal to the ADC circuits 110, and the digital processing circuit can perform an adaptive algorithm (that is, the at least one calibration operation described above) according to the quantized outputs $Q_0$-$Q_{M-1}$ to reduce the offsets or errors of the quantized outputs $Q_0$-$Q_{M-1}$. The above-described calibration circuit 120 is only for illustrative purpose, and the present disclosure is not limited in this regard. Various types of calibration operations and calibration circuits 120 are within the scope of the present disclosure.

As mentioned above, the skew adjusting circuit 130 is electrically coupled to the calibration circuit 120 to receive the quantized outputs $CQ_0$-$CQ_{M-1}$ that have been calibrated. In some embodiments, the skew adjusting circuit 130 can analyze clock skews (equivalent to phase errors) between the ADC circuits 110 according to the quantized outputs $CQ_0$-$CQ_{M-1}$ that have been calibrated to generate a number of adjustment signals $T_0$-$T_{M-1}$. In some embodiments, the skew adjusting circuit 130 outputs the adjustment signals $T_0$-$T_{M-1}$ respectively to the ADC circuits 110. The adjustment signals $T_0$-$T_{M-1}$ are configured to indicate timings required to be adjusted by the ADC circuits 110 due to the clock skews.

In greater detail (M is taken as an even number for example), the skew adjusting circuit 130 analyzes the clock skews (equivalent to time difference information) between the ADC circuits 110 according to the quantized outputs $CQ_0$-$CQ_{M-1}$ to generate the adjustment signals $T_0$-$T_{M-1}$. Because the quantized output $CQ_0$ corresponds to the first sampling time S1 and the quantized output $CQ_1$ corresponds to the second sampling time S2, a time difference between the two corresponding times is 1 sampling period SP. Therefore, time difference information within 1 sampling period SP of the clock signal $CLK_0$ and the clock signal $CLK_1$ can be obtained by analyzing the quantized output $CQ_0$ and the quantized output $CQ_1$. By analogy, time difference information within 1 sampling period SP of each pair of adjacent clock signals of the clock signals $CLK_0$-$CLK_{M-1}$ can be analyzed by the skew adjusting circuit 130, by using this disposition method.

The above-described disposition method for analyzing the time difference information within 1 sampling period SP of each pair of adjacent clock signals of the clock signals $CLK_0$-$CLK_{M-1}$ is only for illustrative purpose, and the present disclosure is not limited in this regard. In some embodiments, the skew adjusting circuit 130 can respectively analyze time difference information within 2 sampling periods SP of the even-numbered clock signals $CLK_0$, $CLK_2 \ldots CLK_{M-2}$ and time difference information within 2 sampling periods SP of the odd-numbered clock signals $CLK_1, CLK_3 \ldots CLK_{M-1}$.

In some embodiments, the ADC circuits 110 can adjust the execution timings of the sampling operations and/or the analog-to-digital conversions according to the adjustment signals $T_0$-$T_{M-1}$ to calibrate the clock skews equivalently. In other embodiments, timings of the clock signals $CLK_0$-$CLK_{M-1}$ can be adjusted directly according to the adjustment signals $T_0$-$T_{M-1}$ to reduce the clock skews equivalently. For example, the adjustment signals $T_0$-$T_{M-1}$ are inputted to a clock generator, a phase interpolator, or a digital delay control line configured to generate the clock signal $CLK_0$-$CLK_{M-1}$ so as to adjust phases of the clock signals $CLK_0$-$CLK_{M-1}$. The above disposition method for reducing the clock skews according to the adjustment signals $T_0$-$T_{M-1}$ is only for illustrative purpose, and the present disclosure is not limited in this regard.

As mentioned above, the output circuit 140 is electrically coupled to the calibration circuit 120 to receive the quantized outputs $CQ_0$-$CQ_{M-1}$ that have been calibrated. The output circuit 140 performs a data combination operation according to the quantized outputs $CQ_0$-$CQ_{M-1}$ that have been calibrated to generate a digital signal SOUT. By using the data combination operation, the quantized outputs $CQ_0$-$CQ_{M-1}$ provided by the M channels can be combined into the single digital signal SOUT having the sampling frequency fs. The sampling frequency fs is M times of a frequency of the clock signal. In some embodiments, the output circuit 140 may be implemented by using a multiplexer circuit, but the present disclosure is not limited in this regard.

Figure 2:
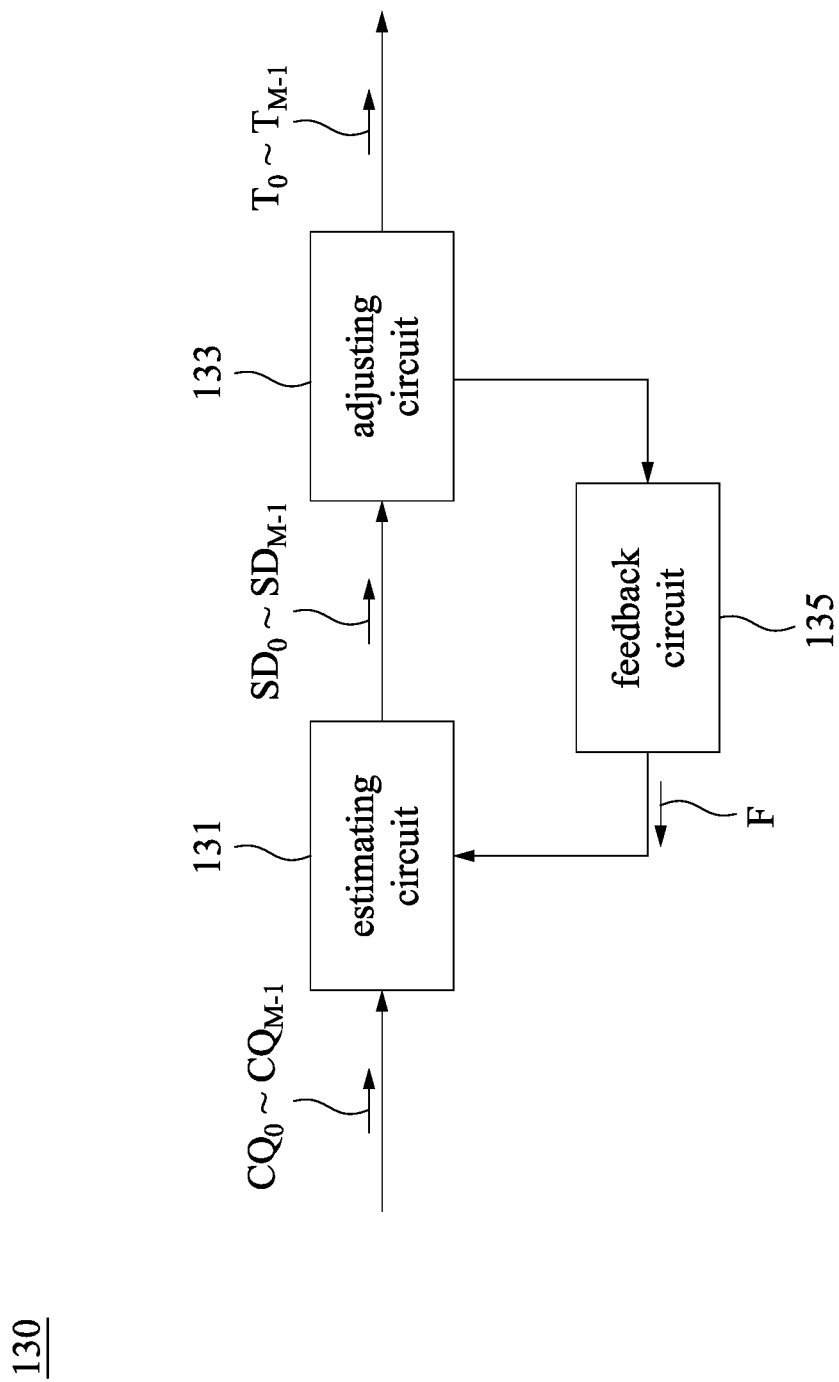
FIG. 2 depicts a block diagram of the skew adjusting circuit in the ADC device in accordance with some embodiments of the present disclosure.

Referring to FIG. 2, FIG. 2 depicts a block diagram of the skew adjusting circuit 130 in accordance with some embodiments of the present disclosure. The skew adjusting circuit 130 includes an estimating circuit 131, an adjusting circuit 133 and a feedback circuit 135. The estimating circuit 131 is configured to perform statistical operations to determine a number of calculation signals (such as $M_0$-$M_{M-1}$ in FIG. 3) respectively corresponding to the quantized outputs $CQ_0$-$CQ_{M-1}$, and average these calculation signals to generate a reference signal (such as REF in FIG. 3). The estimating circuit 131 further compares the reference signal with the calculation signals to generate a number of detection signals $SD_0$-$SD_{M-1}$. The adjusting circuit 133 is configured to generate the above-described adjustment signals $T_0$-$T_{M-1}$ according to the detection signals $SD_0$-$SD_{M-1}$. The operations here will be explained in detail in the following paragraphs with reference to FIG. 3.

Figure 3:
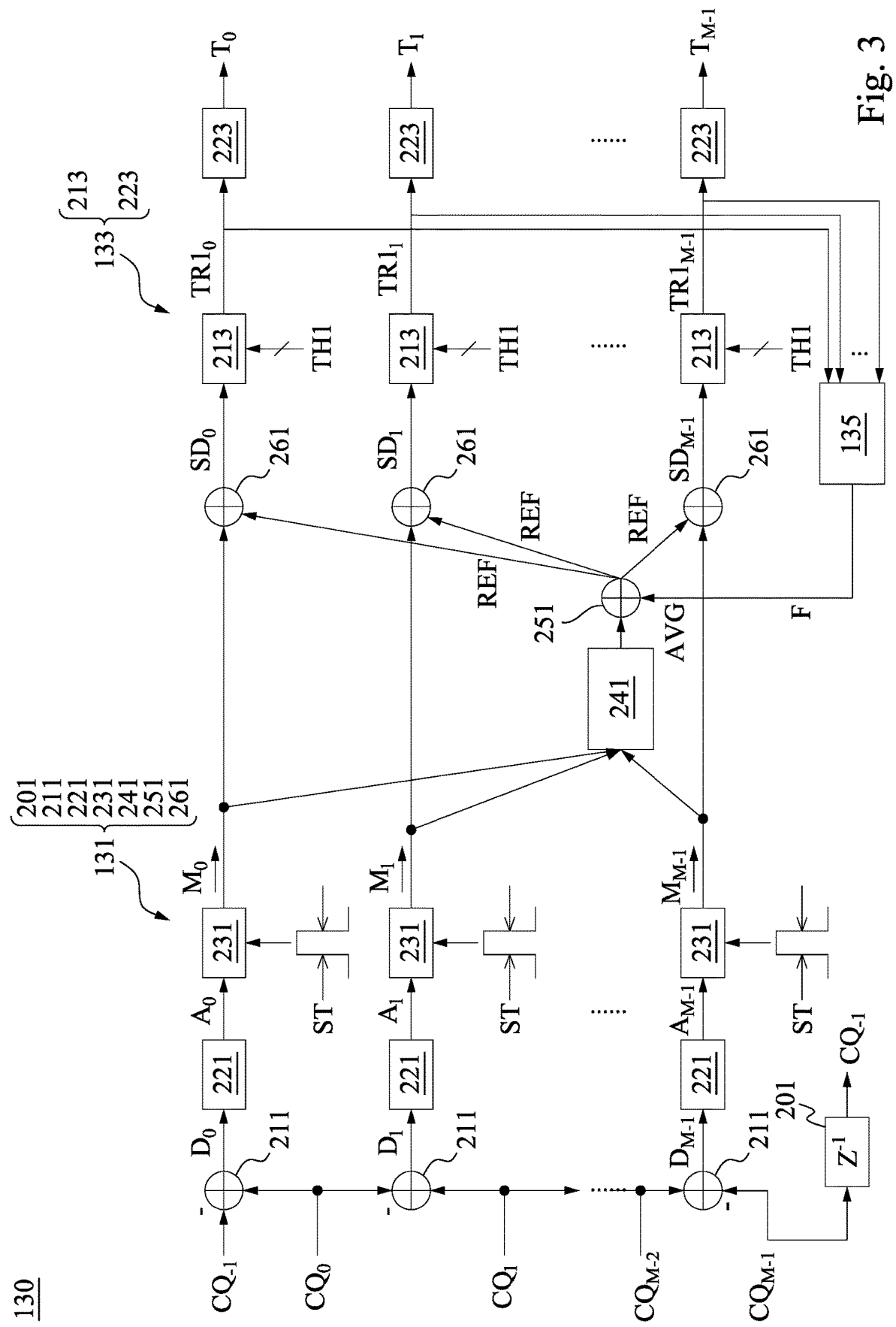
FIG. 3 depicts a circuit diagram of the skew adjusting circuit in the ADC device in accordance with some embodiments of the present disclosure.

Referring to FIG. 3, FIG. 3 depicts a circuit diagram of the skew adjusting circuit 130 in FIG. 2 in accordance with some embodiments of the present disclosure. The estimating circuit 131 includes a delay circuit 201, a number of first computation circuits 211, a number of absolute value circuits 221, a number of statistical circuits 231, an averaging circuit 241, a second computation circuit 251 and a number of comparison circuits 261.

As mentioned above, the delay circuit 201 is configured to delay the quantized output $CQ_{M-1}$ to generate a delayed quantized output $CQ_{-1}$. In some embodiments, a delay time introduced by the delay circuit 201 is equivalent to be M times of the sampling period SP in FIG. 1B. The delay circuit 201 may be implemented by using various digital circuits, such as a buffer, an inverter, a filter, etc. The above implementation method of the delay circuit 201 is only for illustrative purpose, and the present disclosure is not limited in this regard.

The first computation circuits 211 are electrically coupled to the calibration circuit 120 in FIG. 1A. The first computation circuits 211 receive two of the quantized outputs $CQ_0$-$CQ_{M-1}$ in sequence to respectively generate a number of difference signals $D_0$-$D_{M-1}$. The $1^{st}$ first computation circuit 211 is taken for example. The $1^{st}$ first computation circuit 211 receives the quantized outputs $CQ_{-1}$ and $CQ_0$, and subtracts the quantized output $Ca_{-1}$ from the quantized output $CQ_0$ to generate the difference signal $D_0$. Since the disposition method and operation of the remaining first computation circuits 211 can be deduced by analogy, a description in this regard is not repeated here. In some embodiments, the first computation circuit 211 may be implemented by using a subtractor or other processing circuits having the same function. Various circuits that can realize the first computation circuit 211 are within the scope of the present disclosure.

The absolute value circuits 221 are electrically coupled to the first computation circuits 211 to receive the difference signals $D_0$-$D_{M-1}$. Each of the absolute value circuits 221 performs an absolute value operation according to a corresponding difference signal of the difference signals $D_0$-$D_{M-1}$ to generate one of the absolute value signals $A_0$-$A_{M-1}$ correspondingly. The $1^{st}$ absolute value circuit 221 is taken for example. The $1^{st}$ absolute value circuit 221 receives the difference signal $D_0$, and performs the absolute value operation to obtain an absolute value of the difference signal $D_0$ so as to generate the absolute value signal $A_0$. Since the disposition method and operation of the remaining absolute value circuits 221 can be deduced by analogy, a description in this regard is not repeated here. In some embodiments, the absolute value circuit 221 may be implemented by using a processing circuit or a rectifier circuit. Various circuits that can realize the absolute value circuit 221 are within the scope of the present disclosure.

As mentioned above, the statistical circuits 231 are respectively coupled to the absolute value circuits 221 to receive the absolute value signals $A_0$-$A_{M-1}$. Each of the statistical circuits 231 is configured to continuously receive one of the absolute value signals $A_0$-$A_{M-1}$ correspondingly during a predetermined period ST, and perform a statistical operation to output one of the calculation signals $M_0$-$M_{M-1}$ correspondingly.

In some embodiments, the above statistical operation may be a maximum value operation or an average value operation. The $1^{st}$ statistical circuit 231 is taken for example. The $1^{st}$ statistical circuit 231 continuously receives the absolute value signal $A_0$ during the predetermined period ST, and performs the maximum value operation to output the maximum absolute value signal $A_0$ received during the predetermined period ST as the calculation signal $M_0$. Or, the $1^{st}$ statistical circuit 231 continuously receives the absolute value signal $A_0$ during the predetermined period ST, and performs the average value operation to average all the absolute value signals $A_0$ received during the predetermined period ST as the calculation signal $M_0$. Since the disposition method and operation of the remaining statistical circuits 231 can be deduced by analogy, a description in this regard is not repeated here.

In some embodiments, the statistical circuit 231 may be implemented by using a digital processing circuit, a comparator circuit, and/or or a register circuit, but the present disclosure is not limited in this regard. Various circuits that can realize the statistical circuit 231 are within the scope of the present disclosure.

As mentioned above, the average circuit 241 is electrically coupled to the statistical circuits 231 to receive the calculation signals $M_0$-$M_{M-1}$. The average circuit 241 is configured to perform an average value operation according to the calculation signals $M_0$-$M_{M-1}$ to average the calculation signals $M_0$-$M_{M-1}$ so as to generate an average signal AVG. In some embodiments, the average circuit 241 may be implemented by using a digital processing circuit, but the present disclosure is not limited in this regard.

As mentioned above, the second computation circuit 251 is electrically coupled to the average circuit 241 and the feedback circuit 135 to receive the average signal AVG and a feedback signal F. The second computation circuit 251 receives the average signal AVG and the feedback signal F to generate a reference signal REF. For example, the second computation circuit 251 receives the average signal AVG and the feedback signal F, and adds or subtracts the average signal AVG by the feedback signal F to generate the reference signal REF. In some embodiments, the second computation circuit 251 may be implemented by using an adder, a subtractor or other processing circuits having the same function. Various circuits that can realize the second computation circuit 251 are within the scope of the present disclosure.

The comparison circuits 261 are coupled to the second computation circuit 251 to receive the reference signal REF. Each of the comparison circuits 261 is configured to compare one of the calculation signals $M_0$-$M_{M-1}$ with the reference signal REF correspondingly so as to generate one of the detection signals $SD_0$-$SD_{M-1}$ correspondingly. The $1^{st}$ comparison circuit 261 is taken for example. The $1^{st}$ comparison circuit 261 compares the calculation signal $M_0$ with the reference signal REF to generate the detection signals $SD_0$. Since the disposition method and operation of the remaining comparison circuits 261 can be deduced by analogy, a description in this regard is not repeated here. In some embodiments, the comparison circuit 261 may be implemented by using a comparator. In other embodiments, the comparison circuit 261 may be implemented by using a subtractor circuit, and subtracts the corresponding calculation signal from the reference signal REF to generate the detection signal. The above implementation method of the comparison circuit 261 is only for illustrative purpose, and the present disclosure is not limited in this regard.

In some embodiments, the detection signals $SD_0$-$SD_{M-1}$ can be directly outputted as the adjustment signals $T_0$-$T_{M-1}$ of FIG. 1A. In some embodiments, the difference signals $D_0$-$D_{M-1}$ (or the detection signals $SD_0$-$SD_{M-1}$) are related to time information of the clock skews in the multiple channels (or the clock signals $CLK_0$-$CLK_{M-1}$), which can reflect the clock skews generated on the corresponding ADC circuits 110. The operation of the $2^{nd}$ first computation circuit 211 is taken for example. As shown in FIG. 3, since the adjustment signal $T_1$ is generated according to a difference between the quantized output $CQ_0$ and the quantized output $CQ_1$, the adjustment signal $T_1$ can be configured to indicate a time difference between the sampling time S1 corresponding to the quantized output $CQ_0$ and the sampling time S2 corresponding to the quantized output $CQ_1$.

By comparing the calculation signal $M_0$ with the reference signal REF, the influence of the time difference of the clock signal $CLK_0$ caused by the clock skew can be obtained. For example, if the calculation signal $M_0$ is greater than the reference signal REF, it means that the influence of the time difference is positive. Under this condition, the clock skew causes the phase of the clock signal $CLK_0$ to lead incorrectly. Or, if the calculation signal $M_0$ is lower than the reference signal REF, it means that the influence of the time difference is negative. Under this condition, the clock skew causes the phase of the clock signal $CLK_0$ to lag incorrectly. Therefore, the detection signal $SD_0$ will have different logic values according to different comparison results to reflect phase information that the $1^{st}$ ADC circuit 110 needs to be adjusted due to the clock skew. By analogy, the above various operations can be applied to the various adjustment signals $T_0$-$T_{M-1}$ and detection signals $SD_0$-$SD_{M-1}$, so that a description in this regard is not repeated here.

In other embodiments, as shown in FIG. 3, the adjusting circuit 133 includes a number of filter circuits 213 and a number of integrator circuits 223. The filter circuits 213 are respectively coupled to the comparison circuits 261 to receive the detection signals $SD_0$-$SD_{M-1}$.

As mentioned above, the filter circuits 213 generate a number of trigger signals $TR1_0$-$TR1_{M-1}$ according to the detection signals $SD_0$-$SD_{M-1}$ and at least one threshold value TH1. The integrator circuits 223 are respectively coupled to the filter circuits 213 to receive the trigger signals $TR1_0$-$TR1_{M-1}$. The integrator circuits 223 generate the adjustment signals $T_0$-$T_{M-1}$ according to the trigger signals $TR1_0$-$TR1_{M-1}$.

As mentioned above, the $1^{st}$ filter circuit 213 and the $1^{st}$ integrator circuit 223 are taken for example. The filter circuit 213 is electrically coupled to the $1^{st}$ comparison circuit 261 to receive the detection signal $SD_0$. In some embodiments, the filter circuit 213 can continuously accumulate the detection signals $SD_0$, and compare the accumulated detection signal $SD_0$ with at least one threshold value TH1 to output one or more trigger signals $TR1_0$. For example, when the accumulated detection signal $SD_0$ is greater than at least one threshold value TH1, the filter circuit 213 outputs the accumulated detection signal $SD_0$ as the corresponding trigger signal $TR1_0$. The $1^{st}$ integrator circuit 223 is coupled to the $1^{st}$ filter circuit 213 to receive the trigger signal $TR1_0$. The integrator circuit 223 is configured to accumulate the trigger signals $TR1_0$ and output the accumulated trigger signal $TR1_0$ as the adjustment signal $T_0$ so as to match different timing control methods. Since the disposition methods and operations of the remaining filter circuits 213 and integrator circuits 223 can be deduced by analogy, a description in this regard is not repeated here.

By disposing the filter circuit 213, the number of times of calibrating the clock skew can be reduced, thus reducing the dynamic power consumption of the ADC device 100. At the same time, the jitter caused by clock skew calibrations can also be reduced by disposing the filter circuit 213. By disposing the integrator circuit 223, the timing adjustment method can be matched as a corresponding value adjustment method. In practical applications, the filter circuit 213 and the integrator circuit 223 may be selectively disposed depending on practical needs. In addition, the above threshold value TH1 may also be adjusted depending on practical needs.

In different embodiments, the above filter circuit 213 and integrator circuit 223 may be implemented by using at least one comparator (for example, it can be configured to compare the trigger signal with the threshold value TH1 or compare the accumulated trigger signal), at least one register (for example, it can be configured to store the above accumulated signal or accumulated trigger signal, etc.), at least one clear circuit (for example, it can be configured to clear the data in the above register), and/or at least one computation circuit (for example, it can be configured to generate the accumulated signal or to accumulate the trigger signals). The above disposition methods of the filter circuit 213 and the integrator circuit 223 are only for illustrative purpose, and the present disclosure is not limited in this regard.

In above descriptions, the phase information that each of the ADC circuits 110 needs to be adjusted due to the clock skew can be obtained according to comparison results of each of the calculation signals $M_0$-$M_{M-1}$ and the reference signal REF. However, if the reference signal REF generated by the estimating circuit 131 is inaccurate, the phase information that each of the ADC circuits 110 needs to be adjusted due to the clock skew may also be inaccurate, so that the phase errors between the ADC circuits 110 may be incorrectly converged after being adjusted by the skew adjusting circuit 130. It is assumed that the reference signal REF is inaccurate. As shown in FIGS. 2-3, the present disclosure can utilize the feedback circuit 135 to analyze the signals (e.g., $TR1_0$-$TR1_{M-1}$ in FIG. 3) generated by the adjusting circuit 133 to generate the feedback signal F to the estimating circuit 131. Accordingly, the estimating circuit 131 can adjust the inaccurate reference signal REF according to the feedback signal F, so that the reference signal REF is approached to be accurate. It is seen that the estimating circuit 131 can generate the accurate detection signals $SD_0$-$SD_{M-1}$ (equivalent to adjust the detection signals $SD_0$-$SD_{M-1}$) according to the accurate reference signal REF to accurately adjust the phase information that each of the ADC circuits 110 needs to be adjusted due to the clock skew.

Figure 4:
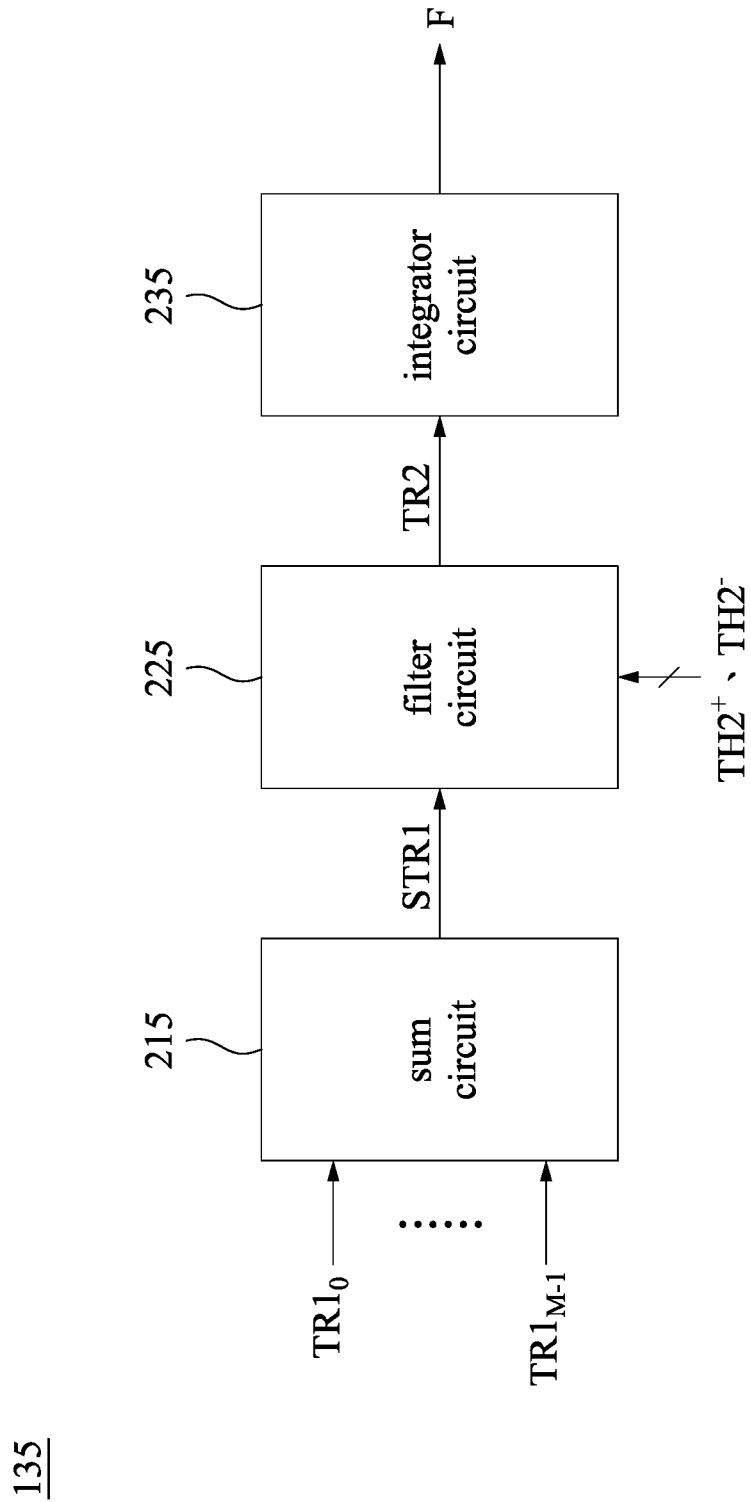
FIG. 4 depicts a block diagram of the feedback circuit in the ADC device in accordance with some embodiments of the present disclosure.

Referring to FIG. 4, FIG. 4 depicts a block diagram of the feedback circuit 135 in FIGS. 2-3 in accordance with some embodiments of the present disclosure. The feedback circuit 135 includes a sum circuit 215, a filter circuit 225, and an integrator circuit 235.

In some embodiments, the sum circuit 215 is electrically coupled to the filter circuits 213 to receive the trigger signals $TR1_0$-$TR1_{M-1}$. The sum circuit 215 is configured to perform a sum operation according to the trigger signals $TR1_0$-$TR1_{M-1}$ to sum the trigger signals $TR1_0$-$TR1_{M-1}$ to generate a sum signal STR1. In some embodiments, the sum circuit 215 may be implemented by using a digital processing circuit and/or a computation circuit, but the present disclosure is not limited in this regard.

As mentioned above, the filter circuit 225 is electrically coupled to the sum circuit 215 to receive the sum signal STR1. In some embodiments, the filter circuit 225 can continuously accumulate the sum signals STR1, and compare the accumulated sum signal STR1 with at least one threshold value (e.g., $TH2^+$ and $TH2^-$ in FIG. 4) to output one or more trigger signals TR2. The trigger signal TR2 would have different logic values (e.g., 1, 0, −1) according to different comparison results to reflect that whether the phase errors between the ADC circuits 110 are correctly converged after being adjusted by the skew adjusting circuit 130.

As shown in FIG. 4, in some embodiments, the filter circuit 225 compares the accumulated sum signal STR1 with a positive threshold value $TH2^+$ and a negative threshold value $TH2^-$. For example, when the accumulated sum signal STR1 is greater than the positive threshold value $TH2^+$, the filter circuit 225 outputs the corresponding trigger signal TR2 (e.g., 1) to reflect that the phase errors may be converged towards an upper limited value of circuit after being adjusted by the skew adjusting circuit 130. When the accumulated sum signal STR1 is smaller than the negative threshold value $TH2^-$, the filter circuit 225 outputs the corresponding trigger signal TR2 (e.g., −1) to reflect that the phase errors may be converged towards a lower limited value of circuit after being adjusted by the skew adjusting circuit 130. When the accumulated sum signal STR1 is between the positive threshold value $TH2^+$ and the negative threshold value $TH2^-$, the filter circuit 225 outputs the corresponding trigger signal TR2 (e.g., 0) to reflect that the phase errors may be correctly converged towards 0 after being adjusted by the skew adjusting circuit 130. In some embodiments, since the implementation method of the filter circuit 225 is similar to the filter circuit 213, a description in this regard is not repeated here.

As mentioned above, the integrator circuit 235 is electrically coupled to the filter circuit 225 to receive the trigger signal TR2. The integrator circuit 235 is configured to accumulate the trigger signals TR2 and output the accumulated trigger signal TR2 as the feedback signal F so as to transmit to the second computation circuit 251 in FIG. 3. As mentioned above, the second computation circuit 251 may add or subtract the average signal AVG by the feedback signal F to adjust the reference signal REF. Accordingly, the comparison circuits 261 may compare each of the calculation signals $M_0$-$M_{M-1}$ with the adjusted reference signal REF to generate the detection signals $SD_0$-$SD_{M-1}$ correspondingly. Since the following operations are similar to those of the above description, a description in this regard is not repeated here. In such way, the phase errors between the ADC circuits 110 may avoid generation of incorrect convergence after being adjusted by the skew adjusting circuit 130. In some embodiments, since the implementation method of the integrator circuit 235 is similar to the integrator circuit 223, a description in this regard is not repeated here.

Figure 5:
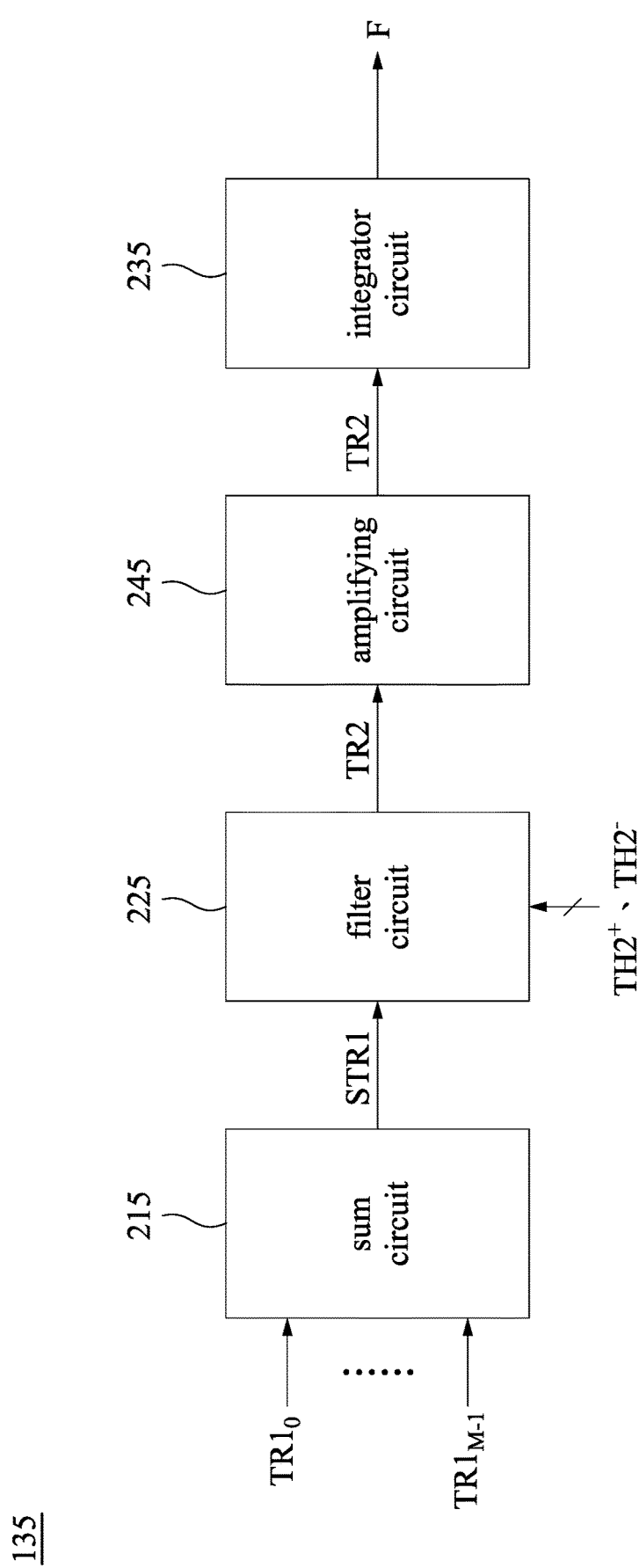
FIG. 5 depicts another block diagram of the feedback circuit in the ADC device in accordance with some embodiments of the present disclosure.

Referring to FIG. 5, in another embodiment, the feedback circuit 135 further includes an amplifying circuit 245. The amplifying circuit 245 is electrically coupled between the filter circuit 225 and the integrator circuit 235 and is configured to amplify the trigger signal TR2 outputted by the filter circuit 225. The following operations are similar to those of the above description, the integrator circuit 235 receives and accumulates the amplified trigger signals TR2 to output the feedback signal F. Since the following operations are similar to those of the above description, a description in this regard is not repeated here.

Figure 6:
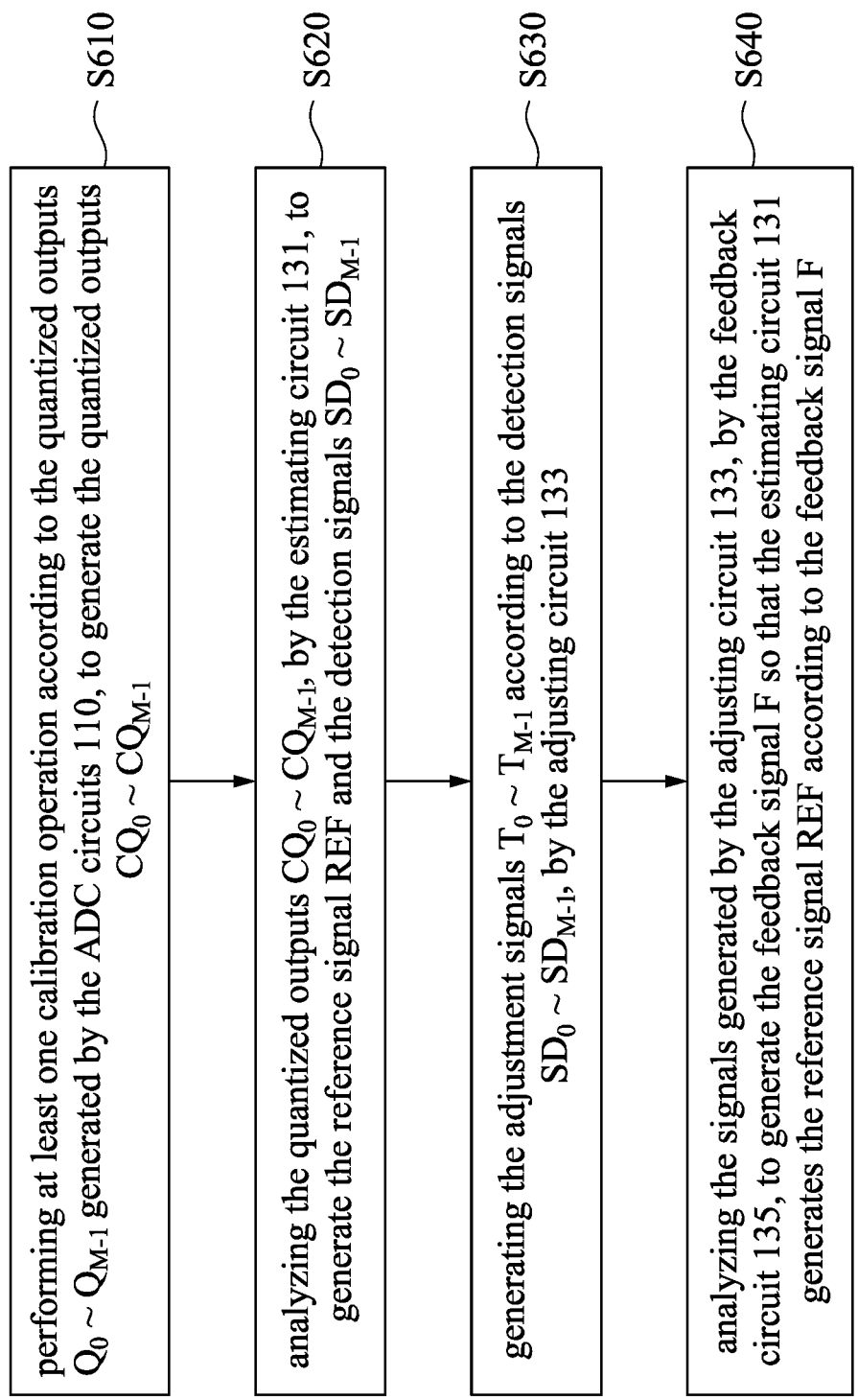
FIG. 6 depicts a flow diagram of a method for calibrating a clock skew in accordance with some embodiments of the present disclosure.

Referring to FIG. 6, FIG. 6 depicts a flow diagram of a method for calibrating a clock skew 600 in accordance with some embodiments of the present disclosure. For ease of understanding, the method for calibrating the clock skew 600 is described with reference to the foregoing figures. In some embodiments, the method for calibrating the clock skew 600 may be executed by the ADC device 100 of FIG. 1A. In one embodiment, the method for calibrating the clock skew 600 first executes step S610 to perform at least one calibration operation according to the quantized outputs $Q_0$-$Q_{M-1}$ generated by the ADC circuits 110, by the calibration circuit 120, to generate the quantized outputs $CQ_0$-$CQ_{M-1}$.

The method for calibrating the clock skew 600 then executes step S620 to analyze the quantized outputs $CQ_0$-$CQ_{M-1}$, by the estimating circuit 131, to generate the reference signal REF and the detection signals $SD_0$-$SD_{M-1}$.

The method for calibrating the clock skew 600 then executes step S630 to generate the adjustment signals $T_0$-$T_{M-1}$ according to the detection signals $SD_0$-$SD_{M-1}$, by the adjusting circuit 133.

After that, the method for calibrating the clock skew 600 executes step S640 to analyze the signals (e.g., $TR1_0$-$TR1_{M-1}$ of FIG. 3) generated by the adjusting circuit 133, by the feedback circuit 135, to generate the feedback signal F so that the estimating circuit 131 generates the reference signal REF according to the feedback signal F. Since the description of the above various steps and their implementation methods may refer to the description of the foregoing embodiments, a description in this regard is not repeated here.

Figure 7:
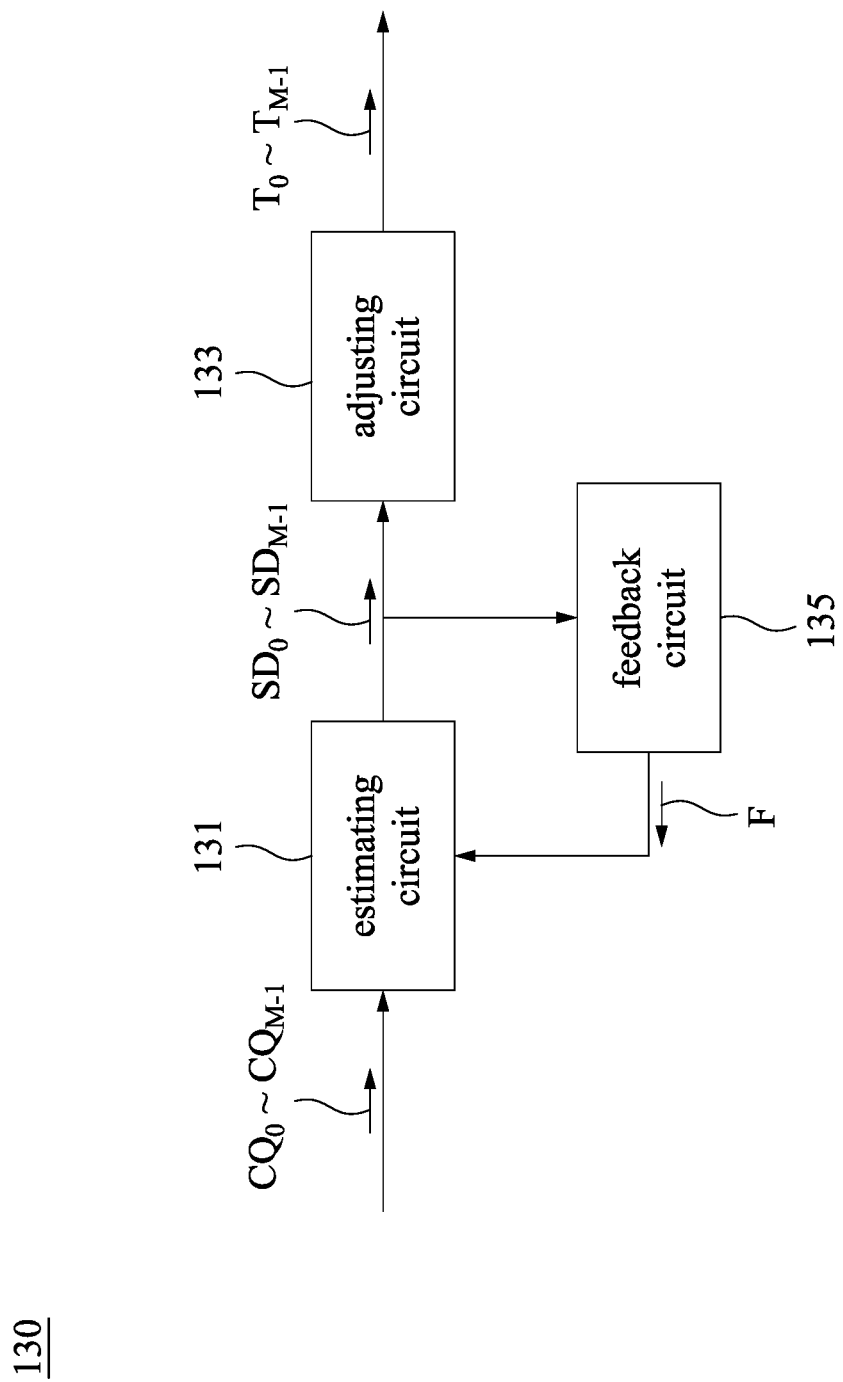
FIG. 7 depicts another block diagram of the skew adjusting circuit in the ADC device in accordance with some embodiments of the present disclosure.

In the embodiments of FIGS. 2-6, the feedback circuit 135 is configured to analyze the trigger signals $TR1_0$-$TR1_{M-1}$ generated by the adjusting circuit 133 to generate the feedback signal F to the estimating circuit 131. However, the present disclosure is not limited herein. Referring to FIG. 7, in another embodiment, the feedback circuit 135 may be configured to analyze the detection signals $SD_0$-$SD_{M-1}$ generated by the estimating circuit 131 to generate the feedback signal F to the estimating circuit 131. That is, the sum circuit 215 is coupled to the comparison circuits 261 to receive the detection signals $SD_0$-$SD_{M-1}$. Since the operations that the feedback circuit 135 generates the feedback signal F according to the detection signals $SD_0$-$SD_{M-1}$ are similar to the above descriptions, a description in this regard is not repeated here.

In sum, by the design of the feedback circuit 135, the ADC device 100 of the present disclosure analyzes the signals generated by the skew adjusting circuit 130 to generate the feedback signal F, so as to compensate the reference signal REF for calibrating the phase errors between the ADC circuits 110. In such way, the phase errors between the ADC circuits 110 may avoid being converged towards the upper limited value or the lower limited value of circuit.

Although the present disclosure has been described in considerable detail with reference to certain embodiments thereof, other embodiments are possible. Therefore, the spirit and scope of the appended claims should not be limited to the description of the embodiments contained herein. It will be apparent to those skilled in the art that various modifications and variations can be made to the structure of the present disclosure without departing from the scope or spirit of the invention. In view of the foregoing, it is intended that the present invention cover modifications and variations of this invention provided they fall within the scope of the following claims.

What is claimed is:

1. An analog to digital converter device, comprising:
   a plurality of analog to digital converter circuits configured to convert an input signal according to a plurality of clock signals, to generate a plurality of first quantized outputs;
   a calibration circuit configured to perform at least one calibration operation according to the first quantized outputs, to generate a plurality of second quantized outputs; and
   a skew adjusting circuit comprising:
      an estimating circuit configured to analyze the second quantized outputs, to generate a plurality of detection signals, wherein the detection signals are related to a plurality of time difference information of the clock signals, the skew adjusting circuit is configured to output the detection signals as a plurality of adjustment signals, and the adjustment signals are configured to reduce a clock skew of the analog to digital converter circuits; and
      a feedback circuit configured to analyze the detection signals generated by the estimating circuit, to generate a feedback signal to the estimating circuit, wherein the estimating circuit is configured to adjust the detection signals according to the feedback signal.

2. The analog to digital converter device of claim 1, wherein the estimating circuit comprises:
   a delay circuit configured to delay a last one of the second quantized outputs, to generate a delayed quantized output;
   a plurality of first computation circuits configured to receive the delayed quantized output and the second quantized outputs in sequence, and configured to generate a plurality of difference signals according to two signals of the delayed quantized output and the second quantized outputs respectively;
   a plurality of absolute value circuits configured to outputs a plurality of absolute value signals, wherein each of the absolute value circuits is configured to perform an absolute value operation according to a corresponding difference signal of the difference signals, to generate a corresponding absolute value signal of the absolute value signals;
   a plurality of statistical circuits configured to receive the absolute value signals during a predetermined period and perform a maximum value operation or an average value operation, to output a plurality of calculation signals;
   an average circuit configured to perform an average value operation to average the calculation signals, to generate an average signal;
   a second computation circuit configured to perform an addition operation according to the average signal and the feedback signal, to generate a reference signal; and
   a plurality of comparison circuits configured to compare each of the calculation signals with the reference signal, to generate the detection signals.

3. The analog to digital converter device of claim 1, wherein the feedback circuit comprises:
   a sum circuit configured to perform a sum operation to sum the detection signals, so as to generate a sum signal;
   a filter circuit configured to generate a trigger signal according to the sum signal and at least one threshold value; and
   an integrator circuit configured to accumulate the trigger signal and output the accumulated trigger signal as the feedback signal.

4. The analog to digital converter device of claim 3, wherein the feedback circuit further comprises an amplifying circuit, the amplifying circuit is coupled between the filter circuit and the integrator circuit and is configured to amplify the trigger signal.

5. The analog to digital converter device of claim 3, wherein the at least one threshold value comprises a positive threshold value and a negative threshold value, the filter circuit compares the sum signal with the positive threshold value and the negative threshold value to generate the trigger signal.

6. An analog to digital converter device, comprising:
   a plurality of analog to digital converter circuits configured to convert an input signal according to a plurality of clock signals, to generate a plurality of first quantized outputs;
   a calibration circuit configured to perform at least one calibration operation according to the first quantized outputs, to generate a plurality of second quantized outputs; and
   a skew adjusting circuit comprising:
      an estimating circuit configured to analyze the second quantized outputs, to generate a plurality of detection signals, wherein the detection signals are related to a plurality of time difference information of the clock signals;

an adjusting circuit configured to generate a plurality of adjustment signals according to the detection signals, wherein the adjustment signals are configured to reduce a clock skew of the analog to digital converter circuits; and a feedback circuit configured to analyze a plurality of first trigger signals generated by the adjusting circuit, to generate a feedback signal to the estimating circuit, wherein the estimating circuit is configured to adjust the detection signals according to the feedback signal.

7. The analog to digital converter device of claim 6, wherein the estimating circuit comprises:

a delay circuit configured to delay a last one of the second quantized outputs, to generate a delayed quantized output;

a plurality of first computation circuits configured to receive the delayed quantized output and the second quantized outputs in sequence, and configured to generate a plurality of difference signals according to two signals of the delayed quantized output and the second quantized outputs respectively;

a plurality of absolute value circuits configured to outputs a plurality of absolute value signals, wherein each of the absolute value circuits is configured to perform an absolute value operation according to a corresponding difference signal of the difference signals, to generate a corresponding absolute value signal of the absolute value signals;

a plurality of statistical circuits configured to receive the absolute value signals during a predetermined period and perform a maximum value operation or an average value operation, to output a plurality of calculation signals;

an average circuit configured to perform an average value operation to average the calculation signals, to generate an average signal;

a second computation circuit configured to perform an addition operation according to the average signal and the feedback signal, to generate a reference signal; and a plurality of comparison circuits configured to compare each of the calculation signals with the reference signal, to generate the detection signals.

8. The analog to digital converter device of claim 6, wherein the adjusting circuit comprises:

a plurality of first filter circuits configured to generate the first trigger signals according to the detection signals and at least one first threshold value; and a plurality of first integrator circuits, wherein each of the first integrator circuits is configured to accumulate a corresponding first trigger signal of the first trigger signals and output the accumulated corresponding first trigger signal as a corresponding adjustment signal of the adjustment signals.

9. The analog to digital converter device of claim 8, wherein the feedback circuit comprises:

a sum circuit configured to perform a sum operation to sum the first trigger signals, so as to generate a sum signal;

a second filter circuit configured to generate a second trigger signal according to the sum signal and at least one second threshold value, wherein the at least one second threshold value comprises a positive threshold value and a negative threshold value; and a second integrator circuit configured to accumulate the second trigger signal and output the accumulated second trigger signal as the feedback signal.

10. The analog to digital converter device of claim 9, wherein the feedback circuit further comprises an amplifying circuit, the amplifying circuit is coupled between the second filter circuit and the second integrator circuit and is configured to amplify the second trigger signal.

11. A method for calibrating a clock skew, comprising:

performing at least one calibration operation according to a plurality of first quantized outputs generated by a plurality of analog to digital converter circuits, to generate a plurality of second quantized outputs;

by an estimating circuit of a skew adjusting circuit, analyzing the second quantized outputs, to generate a plurality of detection signals, wherein the detection signals are related to a plurality of time difference information of a plurality of clock signals received by the analog to digital converter circuits, the skew adjusting circuit is configured to output the detection signals as a plurality of adjustment signals, and the adjustment signals are configured to reduce a clock skew of the analog to digital converter circuits; and by a feedback circuit of the skew adjusting circuit, analyzing the detection signals generated by the estimating circuit, to generate a feedback signal to the estimating circuit, wherein the estimating circuit is configured to adjust the detection signals according to the feedback signal.

12. The method for calibrating the clock skew of claim 11, wherein generating the detection signals comprises:

delaying a last one of the second quantized outputs, to generate a delayed quantized output;

receiving the delayed quantized output and the second quantized outputs in sequence, and generating a plurality of difference signals according to two signals of the delayed quantized output and the second quantized outputs respectively;

performing an absolute value operation according to a corresponding difference signal of the difference signals, to generate a corresponding absolute value signal of a plurality of absolute value signals;

receiving the absolute value signals during a predetermined period, and performing a maximum value operation or an average value operation, to output a plurality of calculation signals;

performing an average value operation to average the calculation signals, to generate an average signal;

performing an addition operation according to the average signal and the feedback signal, to generate a reference signal; and comparing each of the calculation signals with the reference signal, to generate the detection signals.

13. The method for calibrating the clock skew of claim 11, wherein generating the feedback signal comprises:

performing a sum operation to sum the detection signals, so as to generate a sum signal;

generating a trigger signal according to the sum signal and at least one threshold value; and accumulating the trigger signal and outputting the accumulated trigger signal as the feedback signal.

14. The method for calibrating the clock skew of claim 13, wherein after the trigger signal is generated, the trigger signal is amplified.

15. The method for calibrating the clock skew of claim 13, wherein the at least one threshold value comprises a positive threshold value and a negative threshold value, and generating the trigger signal comprises:

comparing the sum signal with the positive threshold value and the negative threshold value.

16. A method for calibrating a clock skew, comprising:
performing at least one calibration operation according to a plurality of first quantized outputs generated by a plurality of analog to digital converter circuits, to generate a plurality of second quantized outputs;
by an estimating circuit, analyzing the second quantized outputs, to generate a plurality of detection signals, wherein the detection signals are related to a plurality of time difference information of a plurality of clock signals received by the analog to digital converter circuits;
by an adjusting circuit, generating a plurality of adjustment signals according to the detection signals, wherein the adjustment signals are configured to reduce a clock skew of the analog to digital converter circuits; and
by a feedback circuit, analyzing a plurality of first trigger signals generated by the adjusting circuit, to generate a feedback signal to the estimating circuit, wherein the estimating circuit is configured to adjust the detection signals according to the feedback signal.

17. The method for calibrating the clock skew of claim 16, wherein generating the detection signals comprises:
delaying a last one of the second quantized outputs, to generate a delayed quantized output;
receiving the delayed quantized output and the second quantized outputs in sequence, and generating a plurality of difference signals according to two signals of the delayed quantized output and the second quantized outputs respectively;
performing an absolute value operation according to a corresponding difference signal of the difference signals, to generate a corresponding absolute value signal of a plurality of absolute value signals;
receiving the absolute value signals during a predetermined period, and performing a maximum value operation or an average value operation, to output a plurality of calculation signals;
performing an average value operation to average the calculation signals, to generate an average signal;
performing an addition operation according to the average signal and the feedback signal, to generate a reference signal; and
comparing each of the calculation signals with the reference signal, to generate the detection signals.

18. The method for calibrating the clock skew of claim 16, wherein generating the adjustment signals comprises:
generating the first trigger signals according to the detection signals and at least one first threshold value; and
accumulating a corresponding first trigger signal of the first trigger signals and outputting the accumulated corresponding first trigger signal as a corresponding adjustment signal of the adjustment signals.

19. The method for calibrating the clock skew of claim 18, wherein generating the feedback signal comprises:
performing a sum operation to sum the first trigger signals, so as to generate a sum signal;
generating a second trigger signal according to the sum signal and at least one second threshold value, wherein the at least one second threshold value comprises a positive threshold value and a negative threshold value; and
accumulating the second trigger signal and outputting the accumulated second trigger signal as the feedback signal.

20. The method for calibrating the clock skew of claim 19, wherein after the second trigger signal is generated, the second trigger signal is amplified.

* * * * *